(12) United States Patent
Pinter

(10) Patent No.: US 7,992,442 B2
(45) Date of Patent: Aug. 9, 2011

(54) COMPONENT AND METHOD FOR ITS MANUFACTURE

(75) Inventor: Stefan Pinter, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 94 days.

(21) Appl. No.: 12/610,536

(22) Filed: Nov. 2, 2009

(65) Prior Publication Data

US 2010/0109105 A1    May 6, 2010

(30) Foreign Application Priority Data

Nov. 3, 2008   (DE) .................. 10 2008 043 382

(51) Int. Cl.
- *H01L 29/84* (2006.01)
- *H01L 21/50* (2006.01)
- *G01L 7/00* (2006.01)

(52) U.S. Cl. ................... 73/714; 438/48; 257/415

(58) Field of Classification Search ............ None
See application file for complete search history.

(56) References Cited

U.S. PATENT DOCUMENTS

| | | | | | |
|---|---|---|---|---|---|
| 5,273,939 | A | * | 12/1993 | Becker et al. | 438/48 |
| 2004/0016995 | A1 | * | 1/2004 | Kuo et al. | 257/678 |
| 2004/0183149 | A1 | * | 9/2004 | Schenk | 257/415 |
| 2009/0084182 | A1 | * | 4/2009 | Muchow et al. | 73/514.34 |
| 2009/0097087 | A1 | * | 4/2009 | Wolter et al. | 359/196.1 |
| 2009/0127640 | A1 | * | 5/2009 | Benzel et al. | 257/419 |

* cited by examiner

*Primary Examiner* — Andre J Allen
(74) *Attorney, Agent, or Firm* — Kenyon & Kenyon LLP

(57) ABSTRACT

A method for reducing microcrack formation and crack growth in the glass carrier of a component having a micromechanical sensor element that is bonded to the glass carrier. The upper side of the glass carrier acts as a bonding surface for the sensor element. The rear side of the glass carrier, situated opposite the upper side, acts as a mounting surface for the component, and the glass carrier has side surfaces that connect the upper side and the rear side. In particular, the glass carrier is formed by a segment of a glass wafer into which at least the contours of the glass carrier have been stamped, so that at least the areas produced in this way of the side surfaces of the glass carrier and the rear side of the glass carrier form a surface that is largely closed and free of microcracks.

9 Claims, 3 Drawing Sheets

US 7,992,442 B2

COMPONENT AND METHOD FOR ITS MANUFACTURE

RELATED APPLICATION INFORMATION

The present application claims priority to and the benefit of German patent application no. 10 2008 043 382.9, which was filed in Germany on Nov. 3, 2008, the disclosure of which is incorporated herein by reference.

FIELD OF THE INVENTION

The present invention relates to a component having a micromechanical sensor element that is bonded onto a glass carrier, the upper side of the glass carrier acting as a bonding surface for the sensor element, the rear side of the glass carrier, opposite the upper side, acting as the mounting surface for the component, and the glass carrier having side surfaces that connect the upper side and the rear side.

In addition, the present invention relates to a method for manufacturing, and possibilities for realizing, a component having a micromechanical sensor element that is connected to a carrier.

BACKGROUND INFORMATION

In practice, components of the type named above are used for example to measure pressure. For this purpose, in the sensor element a pressure-sensitive diaphragm is formed that spans a cavern. As a rule, this cavern is made in the rear side of the sensor element by anisotropic etching; in the case of a silicon sensor element, this is achieved by KOH etching or trench etching. If the component is used for absolute pressure measurement, the cavern is hermetically sealed by the glass carrier so that a defined reference pressure, standardly a vacuum, prevails in the cavern. In this case, the measurement pressure acts only on the front side of the diaphragm. In contrast, components intended for differential pressure acquisition are additionally equipped with a rearward pressure connection in the form of a through-opening in the glass carrier.

In the known component construction, the glass carrier not only seals the cavern, but also acts to reduce mechanical tensions that may result from construction and bonding techniques used during the mounting of the component, e.g. during chip soldering, gluing, etc.

It is known that even the glass-silicon bond of such components is already not free of internal mechanical tensions. These internal tensions arise due to the thermal coefficients of expansion of the silicon and of the glass, which are not matched precisely to each other. Together with the pressure sensitivity, the offset, and thermal influences, this fact is taken into account during an electrical compensation that is carried out after the construction and the electrical connection of the sensor has taken place.

Changes in the mechanical state of tension of the sensor that occur after this compensation result in a drift of the sensor characteristic. In this way, a change in the internal mechanical state of tension has an effect on the diaphragm tension and thus on the deflection of the diaphragm and on its rigidity, resulting in an offset shift and a change in sensitivity. Such a drift of the sensor characteristic is of decisive importance for the precision of the output signal over the entire life span of the component.

After being stored at high temperatures, as well as after storage at high air humidity and increased temperature, such as for example 85° C. and 85% relative humidity, high degrees of drift occur in sensor components that are made of a silicon-glass compound. It is highly probable that this drift is due to a change in the internal mechanical state of tension of the component. This change in the internal mechanical state of tension can be explained by the growth of cracks in the glass. Thus, it is known that microcracks grow at low tension intensities; this is called subcritical crack growth. This crack growth is essentially a function of the air humidity, on mechanical tensions, and on the length of the crack. In the components under consideration here, the exposed glass surfaces, in particular on the lateral walls, mostly have microcracks, which is due to the use of abrasive methods for separating the components. Other surfaces manufactured using abrasive methods, such as for example combined polishing and lapping, also have microcracks.

SUMMARY OF THE INVENTION

The exemplary embodiments and/or exemplary methods of the present invention discloses measures through which formation of microcracks and growth of cracks in the carrier of a compound component having a micromechanical sensor element, and its effects on the component, can be reduced or prevented.

In a component of the type mentioned at the outset, for this purpose according to the exemplary embodiments and/or exemplary methods of the present invention a segment of a glass wafer is used as a glass carrier in which at least the contours of the glass carrier were stamped, so that the areas produced in this way of the side surfaces of the glass carrier and the rear side of the glass carrier have a surface that is largely closed and free of microcracks.

Such components can easily be mass-produced. According to the exemplary embodiments and/or exemplary methods of the present invention, for this purpose a large number of sensor element structures are produced in a semiconductor wafer. Independently of this, a glass wafer is pre-structured in a hot stamping method, during which at least the contours of glass carriers corresponding to the situation and dimensioning of the sensor element structures in the semiconductor wafer are stamped into the rear side of the glass wafer. The structured semiconductor wafer is then bonded onto the front side of the pre-structured glass wafer; during this step, care must be taken to provide a precise adjustment corresponding to the component contours. Only after this has been accomplished are the components separated.

The exemplary embodiments and/or exemplary methods of the present invention is based on the recognition that microcracks occur predominantly in surface areas of the glass carrier that have been processed using abrasive methods and that are exposed; this is true in particular of the side surfaces that result from the separation process. The pre-structuring of the glass wafer that is proposed according to the exemplary embodiments and/or exemplary methods of the present invention turns out to be advantageous in two respects. On the one hand, in a hot stamping method a closed structured glass surface that is as free of microcracks as possible is produced whose trench areas form at least a part of the critical side surfaces. On the other hand, due to these trench areas the intended breakage or saw guide surface that results during the separation process, in which a larger number of microcracks may occur, is made smaller.

The contours stamped into the rear side of the glass wafer advantageously form intended breakage points or saw guides for the individuation process. If the individuation is accomplished by sawing, this process is shortened the thinner the glass layer that has to be cut through is, which ultimately also contributes to savings in manufacturing costs.

As already mentioned at the outset, the component according to the exemplary embodiments and/or exemplary methods of the present invention is particularly suitable for measuring pressure. In this case, in the front side of the sensor element a diaphragm is formed that spans a cavern in the rear side of the sensor element. The glass carrier is bonded against the rear side of the sensor element, so that a pressure-resistant connection is created between the sensor element and the glass carrier. If the component is to be used for absolute pressure measurement, the glass carrier must hermetically seal the cavern. If the component is intended for differential pressure measurements, then as a rule at least one through-opening, acting as a pressure connection, is fashioned in the glass carrier. For this purpose, the through-openings are advantageously also produced during the pre-structuring of the glass wafer. This is because the lateral walls of through-openings stamped into the glass wafer in this way are also largely closed and free of microcracks.

Alternatively to a glass wafer pre-structured through hot stamping, a thinned glass wafer, or a glass-semiconductor composite wafer, may also be used as a carrier material for a component for pressure acquisition. Just as much as the glass layer of a composite wafer, a thinned glass carrier can likewise easily be bonded in pressure-resistant fashion, through anodic bonding, to a micromechanical sensor element in which a diaphragm is formed over a rearward cavern. In both cases, the glass surface liable to microcracks is reduced.

In a third variant, the use of a glass carrier is entirely done without. In this case, a semiconductor wafer is used as carrier material for the front and/or rear side, in which no microcracks occur. The pressure-resistant bonding between the sensor element and the carrier is created here using glass solder.

As discussed in the foregoing, there are various possibilities for constructing and developing the teaching of the present invention in an advantageous manner. For this purpose, on the one hand reference is made to the patent claims that are subordinate to the independent patent claims, and on the other hand reference is made to the description below of several exemplary embodiments of the present invention, on the basis of the drawings.

DETAILED DESCRIPTION

Figure 1:
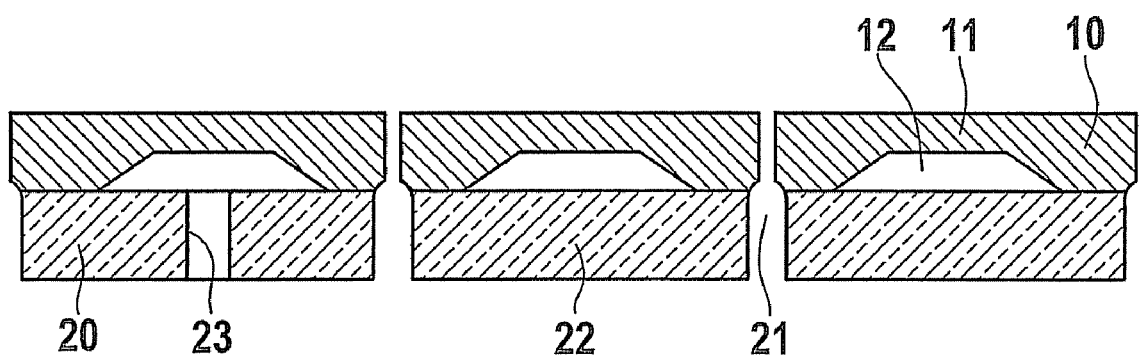
FIG. 1 shows a section through a compound of a structured semiconductor wafer and a glass wafer according to the prior art.

FIG. 1 illustrates the manufacture of pressure sensor elements as known from the prior art. For this purpose, in a silicon wafer 10 a large number of sensor element structures are produced having electronic switching elements for acquiring and evaluating sensor signals. In the exemplary embodiment shown here, these are sensor elements having a diaphragm 11 for pressure acquisition. Diaphragms 11 were exposed in an anisotropic or isotropic etching step starting from the rear side of silicon wafer 10, for example using KOH or TMAH, or also using trench etching. Silicon wafer 10 configured in this way is then bonded to a glass wafer 20. In this way, caverns 12 underneath diaphragms 11 are hermetically sealed so that a reference pressure prevails inside caverns 12. After the anodic bonding, the wafer compound is electrically measured and is separated by sawing, which is indicated by saw cuts 21 in glass wafer 20.

The side surfaces of glass carriers 22 that result in this way have microcracks as a result of the sawing process. Microcracks also occur in the front and rear side of the glass wafer if the surfaces have been processed using sanding, polishing, or lapping methods. However, as a rule only microcracks in exposed surface S that are exposed to environmental influences undergo crack growth. In most cases, such crack growth results in a change in the internal mechanical state of tension of the component compound, which can cause drift of the sensor signal.

If the components are to be used for relative pressure acquisition, then in the area of caverns 12 bores 23 are made in glass wafer 20 as pressure connection openings. For this purpose, abrasive methods are also used, such as ultrasound boring, sandblasting using shadow masks, or boring with microsanding pins. The resulting bore walls have a raw surface that also has microcracks. The growth of these microcracks influences not only the internal mechanical state of tension of the component; microcracks in the wall of a through-opening can also greatly reduce the bursting strength when there is high pressure loading.

For this reason, the surfaces of the glass carrier that are exposed to environmental influences, in particular the side surfaces and the walls of pressure connection openings, should be as free as possible of microcracks, or should at least have very few microcracks.

Figure 2:
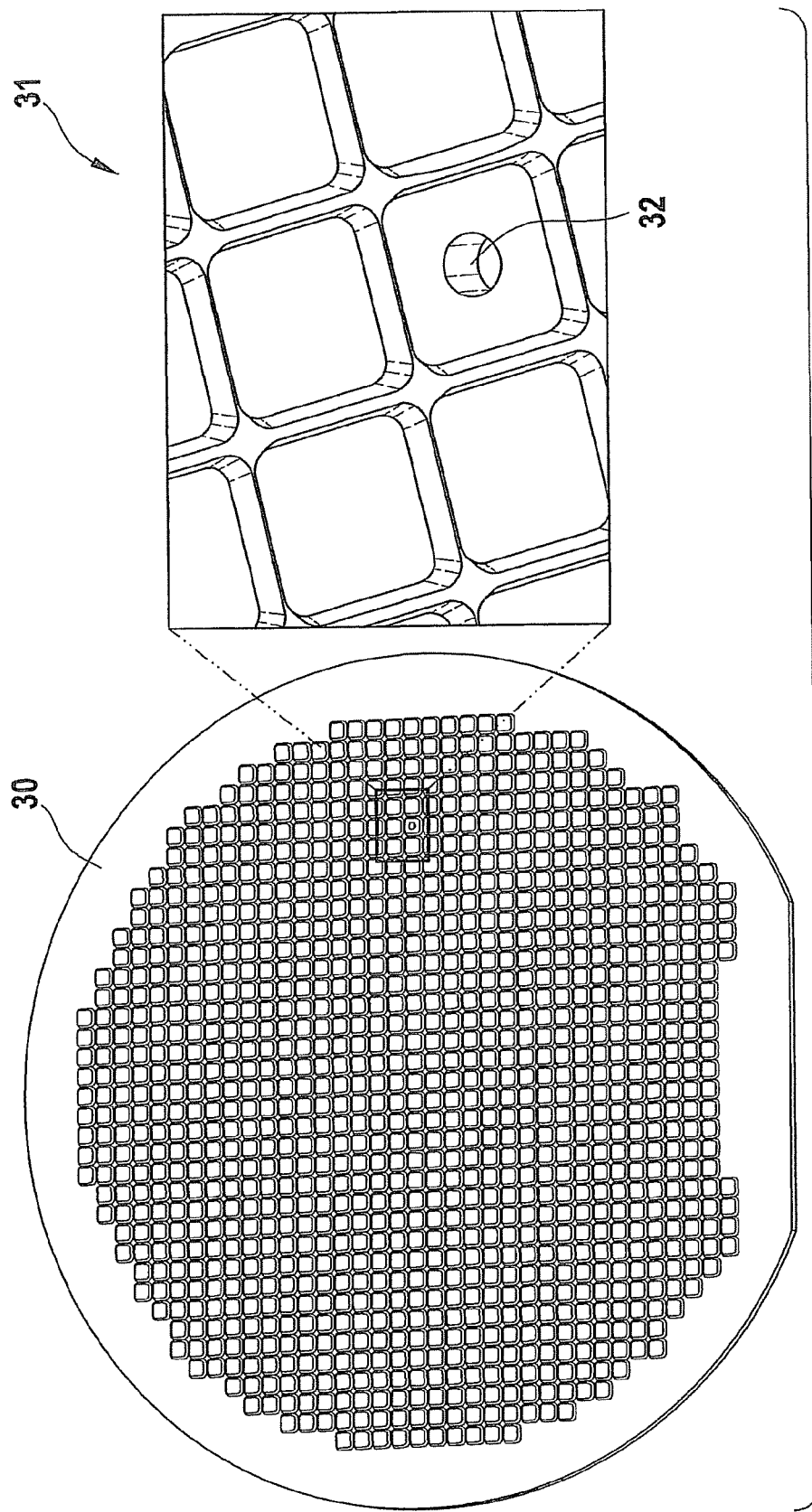
FIG. 2 shows a top view of the rear side of a glass wafer, pre-structured according to the present invention, together with a detail view.

FIG. 2 shows the rear side of a pre-structured glass wafer 30 that according to the exemplary embodiments and/or exemplary methods of the present invention is intended to be used as an alternative to the glass wafer 20 shown in FIG. 1. In the rear side of glass wafer 30, a raster 31 has been stamped whose mesh shape, size, and situation is matched to the situation and design of the sensor element structures on silicon wafer 10. Correspondingly, each mesh of this raster 31 represents the contours of the glass carrier of a component. The structuring of glass wafer 30 took place using vacuum deep-drawing technology, with a hot stamping method. This results in a closed glass surface free of microcracks. Moreover, with this technique, in a stamping step both recesses, such as raster 31; and through-openings 32 can be produced in the glass surface.

In other respects, glass wafer 30 is processed in exactly the same way as is glass wafer 20 shown in FIG. 1. Thus, the unstructured front side of glass wafer 30 can be processed after the stamping step using sanding and polishing or lapping methods in order to achieve a surface quality that is suitable for the anodic bonding. During the separation process, hot-stamped glass wafer 30 is cut through in the thinned areas of raster 31, so that microcracks can arise only at the edges of these thinned areas. For the most part, the separation takes place through sawing. In this case, the recesses of raster 31 act as saw guides. In comparison to the variant shown in FIG. 1, this sawing process requires less time, because the glass layer that is to be cut through is thinner, and the saw width can therefore also be reduced. The structured rear side of glass wafer 30 is free of microcracks because no abrasive processing takes place after the hot stamping.

Figure 3:
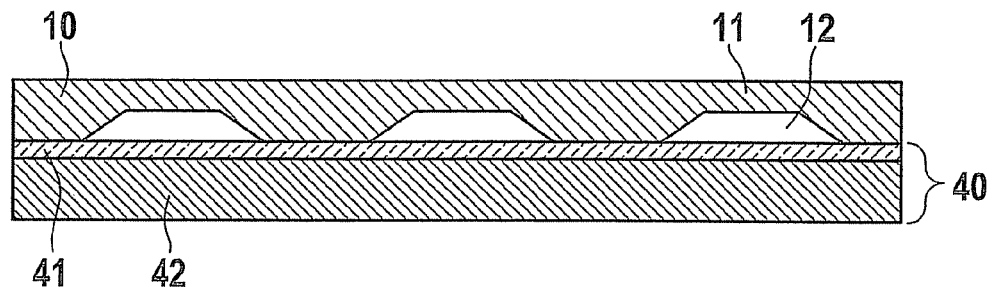
FIG. 3 shows a section through a compound of the structured semiconductor wafer and composite wafer before the separation of the pressure sensor components.

Alternatively to pre-structured glass wafer 30 described in connection with FIG. 2, a glass wafer that has been thinned as a whole could also be used as a carrier. In this case, the side surfaces that result during the separation process are also relatively small. Depending on the application or location of use of the pressure sensor components described here, the use of a glass semiconductor composite wafer having a thinned glass layer as a carrier material may be preferred. This variant is shown in FIG. 3. Here, composite wafer 40 is made up of a glass wafer 41 that has been bonded anodically against a silicon wafer 42. Subsequently, glass layer 41 was thinned, using known methods such as sanding, polishing, or lapping, down to a very thin layer thickness, the glass surface being prepared for the anodic bonding onto it of structured silicon wafer 10. This, as well as the separation of the component, then takes place analogously to the process described in the foregoing.

Figure 4:
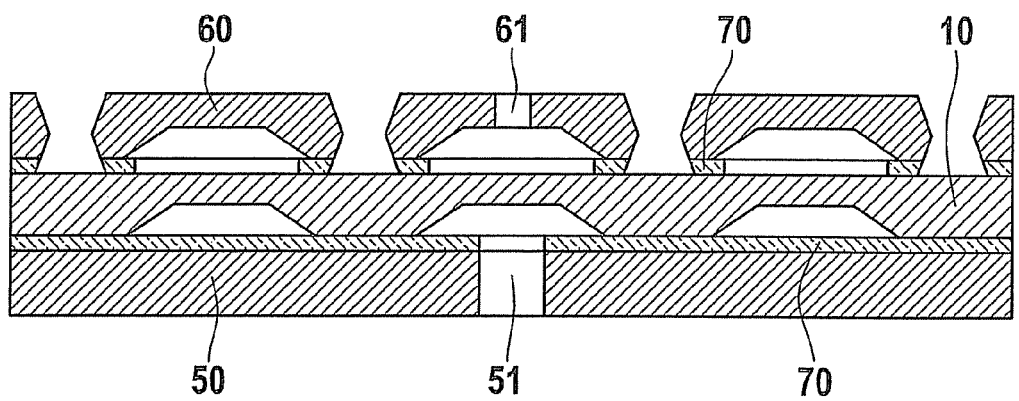
FIG. 4 shows a section through a compound of a semiconductor wafer having pressure sensor element structures, a cap wafer, and a wafer acting as a carrier.

In the pressure sensor components described here, the carrier is a component of the sensor structure in that it hermetically seals the cavern underneath the diaphragm, so that a reference volume is created for absolute pressure measurements. In combination with silicon sensor elements, the use of glass carriers is particularly advantageous because in this case it is easy, using anodic bonding, to create a pressure-resistant connection between the sensor element and the carrier. Such a bond can alternatively also be produced using a glass solder layer. In this case, other carrier materials can also be used, such as a silicon wafer, as is shown in FIG. 4. This construction includes a structured silicon wafer 10 having sensor element structures and electronic circuit elements.

Structured silicon wafer 10 is sandwiched between a silicon wafer 50 that acts as a carrier and a silicon wafer 60 that acts as a cap wafer and that is correspondingly structured. The bond between the adjacent surfaces was created in each case via a glass solder layer 70. Here, depending on the application, the pressure loading of a sensor diaphragm 11 takes place via a pressure connection opening 51, 61 in carrier 50 and/or in cap wafer 60.

What is claimed is:

1. A component for measuring pressure, comprising:
   a glass carrier; and
   a micromechanical sensor element that is bonded onto the glass carrier, an upper side of the glass carrier acting as a connection surface for the sensor element, and a rear side, opposite the upper side, of the glass carrier acting as an mounting surface for the component, and the glass carrier having lateral surfaces that connect the upper side and the rear side;
   wherein the glass carrier is formed by a segment of a glass wafer into which at least contours of the glass carrier were stamped, so that at least the areas produced in this way of the lateral surfaces of the glass carrier and the rear side of the glass carrier have a surface that is largely closed and free of microcracks.

2. The component of claim 1, further comprising:
   a diaphragm in the front side of the sensor element that spans a cavern in the rear side of the sensor element, wherein a pressure-resistant connection exist between the sensor element and the glass carrier.

3. The component of claim 2, wherein at least one through-opening, which acts as a pressure connection, is in the glass carrier, which opening was stamped into the glass wafer together with the contours of the glass carrier, so that a lateral wall of the through-opening has a surface that is largely closed and free of microcracks.

4. A method for manufacturing components, the method comprising:
   producing a multitude of sensor element structures in a semiconductor wafer;
   bonding the semiconductor wafer, which is structured in this way, onto a glass wafer; and
   separating the components;
   wherein the glass wafer is pre-structured in a hot stamping process, and wherein at least the contours of the glass carriers are stamped into the rear side of the glass wafer corresponding to a situation and dimensioning of the sensor element structures in the semiconductor wafer, and
   wherein each of the components is for measuring pressure, and includes:
   a glass carrier; and
   a micromechanical sensor element that is bonded onto the glass carrier, an upper side of the glass carrier acting as a connection surface for the sensor element, and a rear side, opposite the upper side, of the glass carrier acting as an mounting surface for the component, and the glass carrier having lateral surfaces that connect the upper side and the rear side;
   wherein the glass carrier is formed by a segment of a glass wafer into which at least contours of the glass carrier were stamped, so that at least the areas produced in this way of the lateral surfaces of the glass carrier and the rear side of the glass carrier have a surface that is largely closed and free of microcracks.

5. The method of claim 4, wherein the contours stamped into the rear side of the glass wafer form one of saw guide tracks and predetermined breakage points in the separation of the components.

6. The method of claim 4, wherein during the pre-structuring of the glass wafer, through-openings are also produced as pressure connection openings.

7. The component of claim 1, wherein a thinned glass wafer is the carrier material, wherein a diaphragm for measuring pressure is formed in a front side of the sensor element, wherein the diaphragm spans a cavern in a rear side of the sensor element, and wherein the rear side of the sensor element is connected in a pressure-resistant fashion to the carrier by anodic bonding.

8. The component of claim 1, wherein a glass-semiconductor composite wafer having a thinned glass layer is the carrier material, wherein a diaphragm for measuring pressure is in a front side of the sensor element, wherein the diaphragm spans a cavern in a rear side of the sensor element, and wherein the rear side of the sensor element is connected in pressure-resistant fashion to the glass surface of the carrier by anodic bonding.

9. The component of claim 1, wherein a semiconductor wafer is the carrier material, wherein a diaphragm for measuring pressure is in a front side of the sensor element, wherein the diaphragm spans a cavern in a rear side of the sensor element, and wherein the rear side of the sensor element is connected in pressure-resistant fashion to the carrier with the aid of glass solder.

* * * * *